(12) United States Patent
Liu et al.

(10) Patent No.: US 11,385,744 B2
(45) Date of Patent: Jul. 12, 2022

(54) TOUCH KEY STRUCTURE AND ELECTRICAL APPLIANCE

(71) Applicant: FOSHAN SHUNDE MIDEA ELECTRICAL HEATING APPLIANCES MANUFACTURING CO., LTD., Foshan (CN)

(72) Inventors: Xiaokai Liu, Foshan (CN); Yi Sun, Foshan (CN); Pofeng Ho, Foshan (CN); Zhifeng Wang, Foshan (CN); Dali Ou, Foshan (CN); Dahua Cao, Foshan (CN); Qi Wang, Foshan (CN); Yuhua Huang, Foshan (CN)

(73) Assignee: FOSHAN SHUNDE MIDEA ELECTRICAL HEATING APPLIANCES MANUFACTURING CO., LTD., Foshan (CN)

(*) Notice: Subject to any disclaimer, the term of this patent is extended or adjusted under 35 U.S.C. 154(b) by 137 days.

(21) Appl. No.: 16/770,539

(22) PCT Filed: Aug. 31, 2018

(86) PCT No.: PCT/CN2018/103635
§ 371 (c)(1),
(2) Date: Jun. 5, 2020

(87) PCT Pub. No.: WO2019/169839
PCT Pub. Date: Sep. 12, 2019

(65) Prior Publication Data
US 2021/0165513 A1  Jun. 3, 2021

(30) Foreign Application Priority Data

Mar. 8, 2018 (CN) .......................... 201810193657.2
Mar. 8, 2018 (CN) .......................... 201820323233.9

(51) Int. Cl.
*G06F 3/044* (2006.01)

(52) U.S. Cl.
CPC ................................... *G06F 3/044* (2013.01)

(58) Field of Classification Search
CPC ...................................................... G06F 3/044
See application file for complete search history.

(56) References Cited

U.S. PATENT DOCUMENTS

2005/0179673 A1  8/2005  Philipp et al.
2009/0267911 A1  10/2009  Huang et al.

FOREIGN PATENT DOCUMENTS

CN  201639562 U  11/2010
CN  202206358 U   4/2012
(Continued)

OTHER PUBLICATIONS

Intelletctual Property Office of Korea (IPKR) The Office Action for KR Application No. 10-2020-7004502 dated Nov. 25, 2020 10 Pages (Translation Included ).

(Continued)

*Primary Examiner* — Michael Pervan
(74) *Attorney, Agent, or Firm* — Anova Law Group, PLLC

(57) ABSTRACT

A touch key structure includes a touch panel including a key area at a front side of the touch panel, a circuit board provided behind the touch panel and including a sensing electrode corresponding to the key area, and a conductive medium provided between the key area and the sensing electrode.

14 Claims, 18 Drawing Sheets

(56) References Cited

FOREIGN PATENT DOCUMENTS

| | | | | |
|---|---|---|---|---|
| CN | 202889318 U | 4/2013 | | |
| CN | 205750750 U | 11/2016 | | |
| CN | 106484168 A | 3/2017 | | |
| CN | 207884596 U | 9/2018 | | |
| JP | 2017021579 A | 1/2017 | | |
| JP | 2018006228 A | 1/2018 | | |
| KR | 20080026791 A | 3/2008 | | |
| KR | 20160053919 A | * 5/2016 | ........... | G06F 3/0445 |
| WO | 2008035838 A1 | 3/2008 | | |

OTHER PUBLICATIONS

The European Patent Office (EPO) Supplementary Search Report for EP Application No. 18908364.5 dated Aug. 13, 2020 1 Page.
The European Patent Office (EPO) Extended Search Report for EP Application No. 18908364.5 dated Jul. 27, 2020 7 Pages.
Japan Patent Office Reasons for Refusal For Japanese Application No. 2020517560 dated Mar. 24, 2021 8 Pages (including English translation).
World Intellectual Property Organization (WIPO) International Search Report for PCT/CN2018/103635 dated Dec. 5, 2018 7 Pages.

* cited by examiner

TOUCH KEY STRUCTURE AND ELECTRICAL APPLIANCE

CROSS-REFERENCE TO RELATED APPLICATIONS

This application is a National Stage Entry under 35 U.S.C. § 371 of International Application No. PCT/CN2018/103635, filed Aug. 31, 2018, which claims priority to Chinese Application Nos. 201820323233.9 and 201810193657.2, both filed Mar. 8, 2018, the entire contents of all of which are incorporated herein by reference.

TECHNICAL FIELD

The present disclosure relates to the technical field of touch control technology, and in particular, to a touch key structure and an electrical appliance.

BACKGROUND

Electronics are equipped with the touch key configured to replace the traditional mechanical key. The touch key has following advantages over the traditional mechanical key:

1. Without any movable mechanical parts, the touch key will not wear out and has an infinite life, which reduces the subsequent maintenance costs.

2. The sensing part of the touch key can be placed behind any insulating layer (such as, glass layer or plastic layer or ceramic layer, etc.), so the sensing part may be easily made into a sealed keyboard, thereby protecting it from moisture and water.

3. The panel pattern, the size and shape of the touch key can be arbitrarily designed, and characters, trademarks, perspective windows, etc., can be arbitrarily matched with each other. So the touch key has advantages that the metal panels and the mechanical panels do not have, such as, beautiful and fashionable appearance, no fading, no deformation, and good durability. As such the touch key can replace the existing ordinary panels (including metal keyboard, membrane keyboard, conductive plastic keyboard) due to its reliability and arbitrary aesthetic design.

Capacitive touch-sensing key, as the most common touch key, is actually just a small piece of "metal electrode" on the PCB, which forms a sensing capacitor with the surrounding "ground signal." When a finger is close to the area above the electrode, the electric field would be interfered, causing a corresponding change in capacitance. Based on the change in capacitance, whether a human body approaches or touches the touch key can be detected. For the current capacitive touch-sensing key, an insulating cover layer such as glass layer should be placed on the sensing electrode due to safety factor and aesthetics factor etc., and the human finger is coupled with the metal sensing sheet through the cover to make the induced capacitance change (usually several pF). However, in some applications, since wire plug, digital tube, capacitor and LED are on the circuit board, the circuit board cannot be directly mounted under the cove. So that some transfer methods are needed. The most common method is to build a capacitive sensor using a spring. For example, FIGS. 1 to 3 show a capacitive touch sensing key 100' having a capacitive sensor constructed by using the spring, the capacitive touch sensing key 100' includes a touch panel 1', a PCB board 2' and a key support 3'. A space is formed between the touch panel 1' and the PCB board 2' to accommodate components such as the wire plug (not labeled), the digital tube (not labeled), and a spring 4', etc. PCB board 2' is soldered with the spring 4'. The spring 4' abuts between the touch panel 1' and the PCB board 2' through its both ends.

However, using the spring 4' as a sensing electrode abutting between the PCB 2' and the touch panel 1' has many disadvantages.

First, because each key must be equipped with one spring 4', the cost is increased.

Second, the processes of mounting and soldering the spring 4' on the PCB board 2' are both relatively complicated. The pin of the touch spring 4' should be inserted into the through hole of the PCB board 2', then the spring 4' is soldered with the PCB board 2' through wave soldering. A lot of labor and fixtures are required, and the process is prone to problems such as loosening, skewing, displacement, poor welding, etc., which increases the cost of the process and the difficulty of quality assurance.

In addition, during the complete assembly of the product, the spring 4' is prone to skewing as it is compressed and tightened by the panel, which is prone to skewing. If it is subjected to large amplitude vibration or impact during use, the spring 4' is easily detached from the mounting position, causing the touch function to fail.

In view of this, it is necessary to improve the existing capacitive touch-sensing key to provide a reliable capacitive touch-sensing key further with an easy mounting advantage.

SUMMARY

The main objective of the present disclosure is to provide a touch key structure and an electrical appliance, which aim to improve a simple and reliable touch key structure to solve the problems of the complex structure and poor stability of the existing capacitive touch-sensing key structure.

In order to achieve the above objective, the present disclosure provides a touch key structure, including:

a touch panel, wherein a front side of the touch panel has a key area for a user to touch;

a circuit board provided behind the touch panel, wherein the circuit board is provided with a sensing electrode corresponding to the key area; and a conductive medium provided between the key area and the sensing electrode.

The present disclosure further provides an electrical appliance including a touch key structure, the touch key structure including:

a touch panel, wherein a front side of the touch panel has a key area for a user to touch;

a circuit board provided behind the touch panel, wherein the circuit board is provided with a sensing electrode corresponding to the key area; and a conductive medium provided between the key area and the sensing electrode.

In the technical solutions of the present disclosure, a sensing electrode is provided on the circuit board, and a conductive medium is provided between a key area of the touch panel and the sensing electrode. When a user's finger touches or approaches the key area, the finger and the sensing electrode form a capacitance. The capacitance is increased because the conductive medium is provided, and can be sensitively sensed when a finger approaches or touches the key area. Therefore, in the present disclosure, the sensing electrode and the conductive medium are easy to be mounted and have good stability after mounting, thereby making the touch key structure simple and reliable.

BRIEF DESCRIPTION OF THE DRAWINGS

In order to more clearly illustrate the embodiments of the present disclosure or the technical solutions in the related art, the drawings used in the embodiments or the related art will be briefly described below. Obviously, the drawings in the following description are only some embodiments of the present disclosure. It will be apparent to those skilled in the art that other figures can be obtained from the structures illustrated in the drawings without the inventive effort.

DESCRIPTION OF REFERENCE NUMERALS IN THE RELATED ART

TABLE 1

Figure 1:
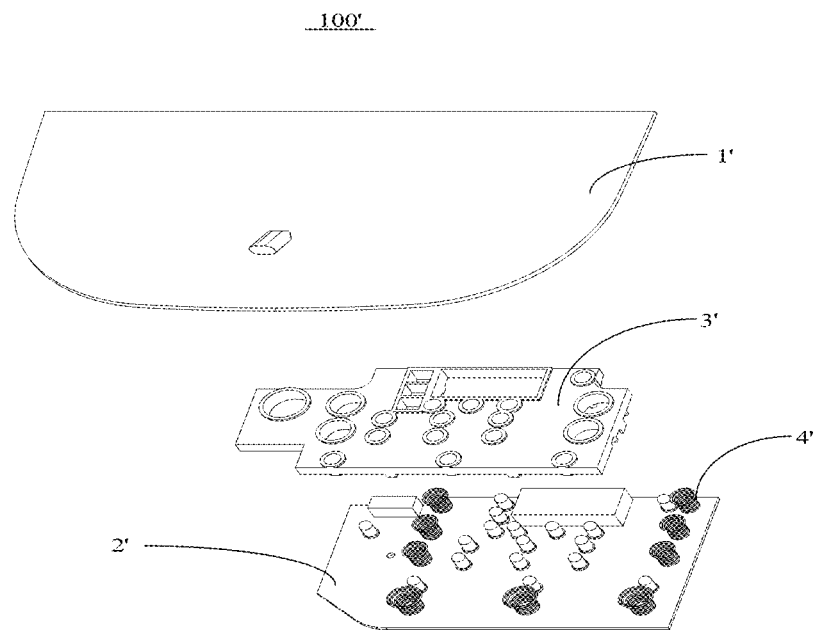
FIG. 1 is a schematic exploded perspective view of a capacitive touch-sensing key in the related art.
Figure 2:
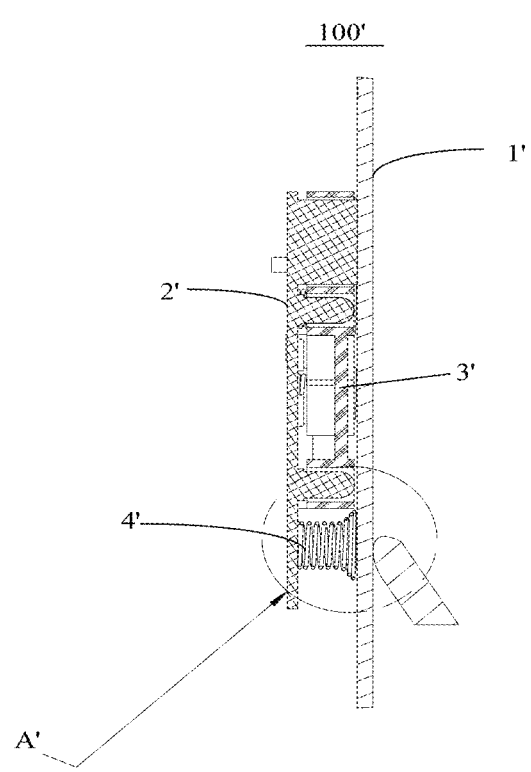
FIG. 2 is a schematic cross-sectional view of the capacitive touch-sensing key in FIG. 1.
Figure 3:
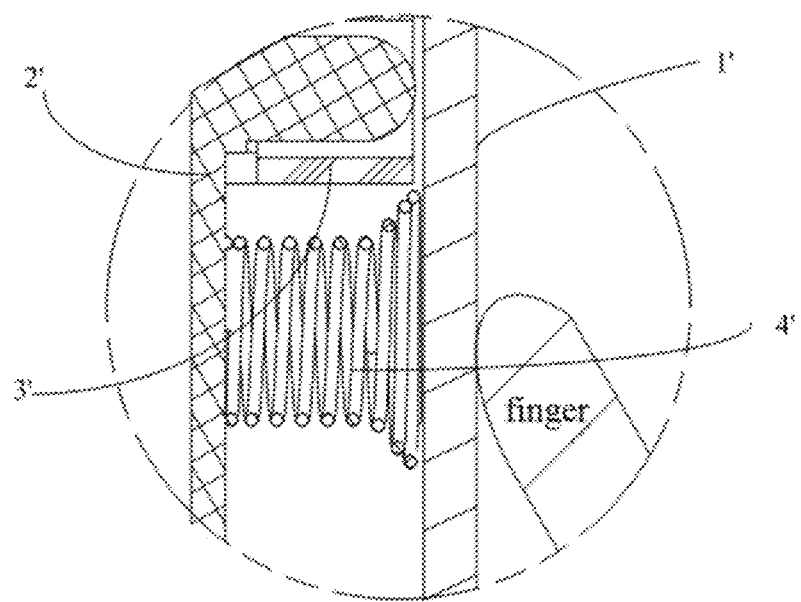
FIG. 3 is an enlarged view of portion A' in FIG. 2.
Figure 4:
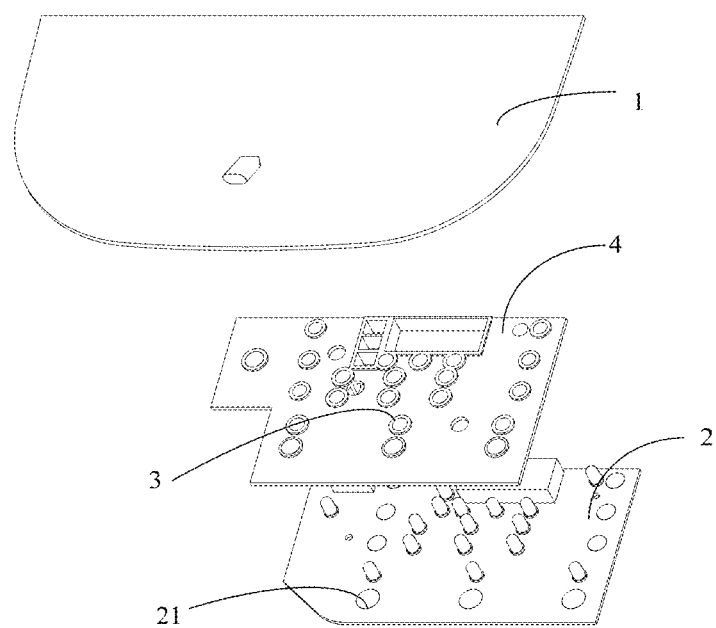
FIG. 4 is a schematic structural perspective view of a touch key structure according to a first embodiment of the present disclosure.
Figure 5:
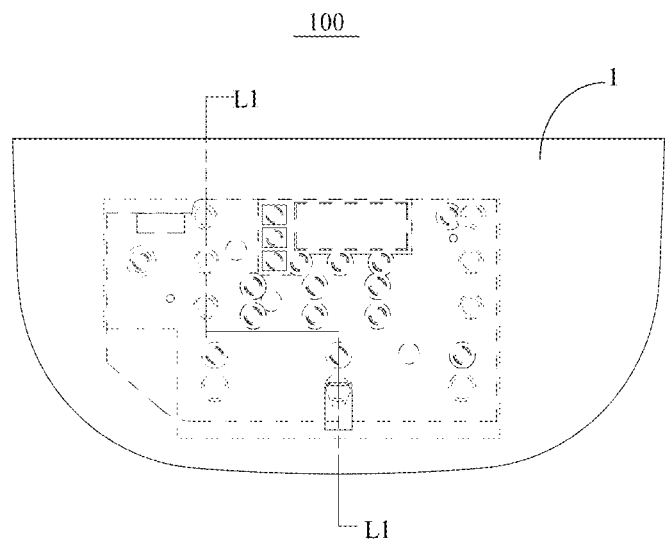
FIG. 5 is a schematic structural plan view in FIG. 4.
Figure 6:
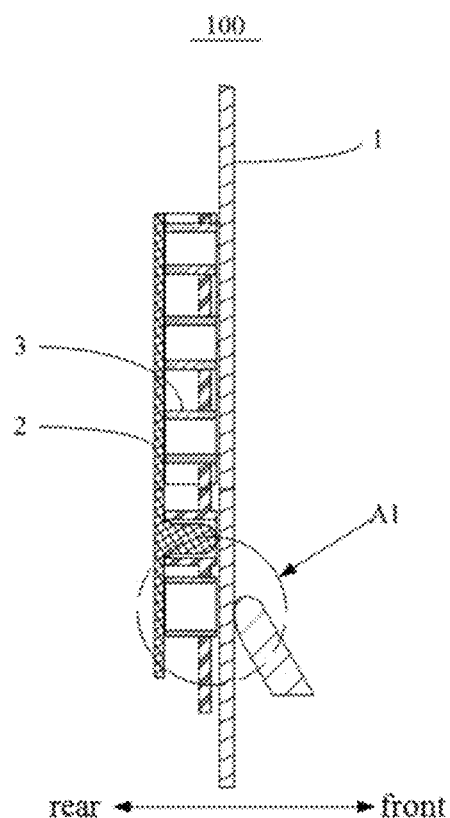
FIG. 6 is a schematic cross-sectional view taken along line L1-L1 in FIG. 4.
Figure 7:
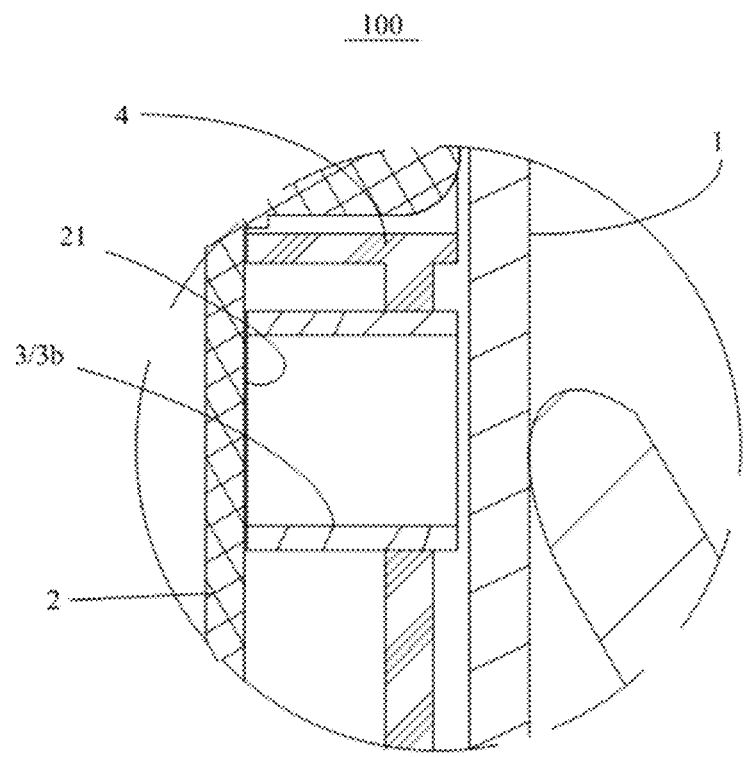
FIG. 7 is an enlarged view of portion A1 in FIG. 6.

| Reference Numeral | Name | Reference Numeral | Name |
|---|---|---|---|
| 100' | Capacitive touch-sensing key | 3' | Key support |
| 1' | Touch panel | 4' | Spring |
| 2' | PCB board | | |

DESCRIPTION OF REFERENCE NUMERALS IN THE PRESENT DISCLOSURE

TABLE 2

| Reference Numeral | Name | Reference Numeral | Name |
|---|---|---|---|
| 100 | Touch key structure | 3 | Conductive medium |
| 1 | Touch panel | 3a | Conductive layer |
| 1a | Pillar | 3b | Conductive body |
| 1b | Cylindrical body | 4 | Support |
| 2 | Circuit board | 41 | Mounting hole |
| 21 | Sensing electrode | 42 | Convex part |

The realization of the objective, functional characteristics, advantages of the present disclosure are further described with reference to the accompanying drawings.

DETAILED DESCRIPTION OF THE EMBODIMENTS

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present disclosure without creative efforts shall fall within the protection scope of the present disclosure.

It is to be understood that, all of the directional indications in the embodiments of the present disclosure (such as up, down, left, right, front, rear . . . ) can only be used for explaining relative position relations, moving condition of the elements under a special attitude (referring to figures), and so on, if the special attitude changes, the directional indications change accordingly.

In addition, the descriptions, such as the "first," the "second" in the embodiment of present disclosure, can only be used for describing the aim of description, and cannot be understood as indicating or suggesting relative importance or impliedly indicating the number of the indicated technical character. Therefore, the character indicated by the "first," the "second" can expressly or impliedly include at least one character. Besides, the technical solution of each embodiment can be combined with each other, however the technical solution must be based on that the ordinary skill in that art can realize the technical solution. When the combination of the technical solutions is contradictory or cannot be realized, it should consider that the combination of the technical solutions does not exist, and is beyond the claimed protection scope of the present disclosure.

Figure 32:
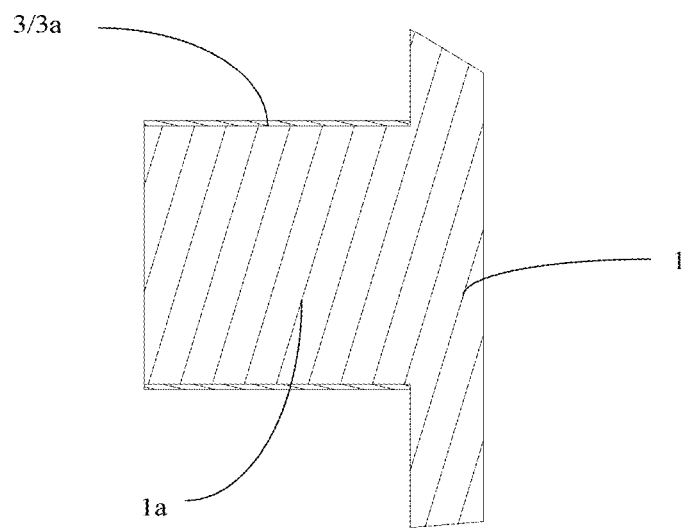
FIG. 32 is a partial schematic structural view of the touch panel and the conductive layer in FIG. 26 according to a fourth implementation.
Figure 33:
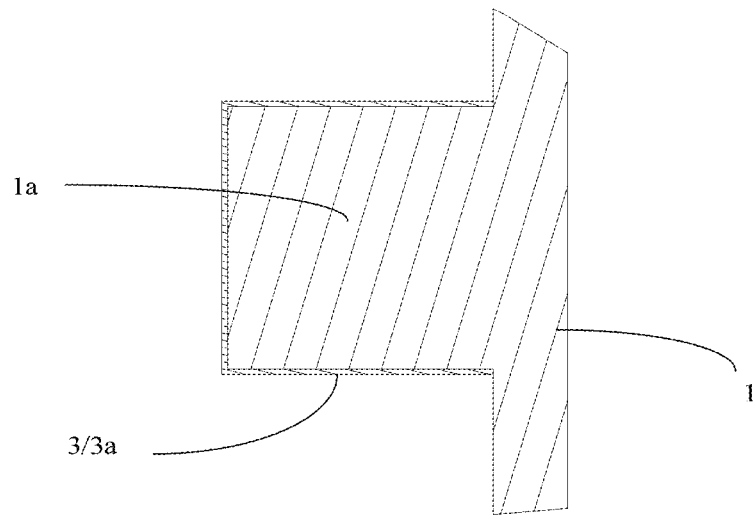
FIG. 33 is a partial schematic structural view of the touch panel and the conductive layer in FIG. 26 according to a fifth implementation.
Figure 34:
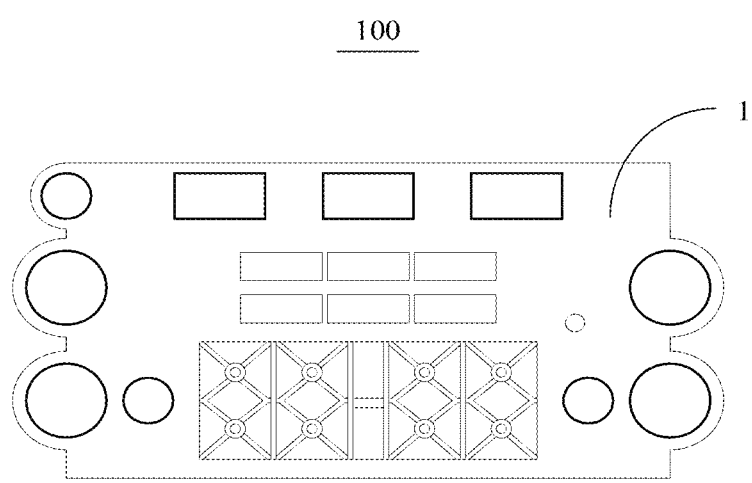
FIG. 34 is a schematic structural perspective view of a touch key structure according to a fifth embodiment of the present disclosure.
Figure 35:
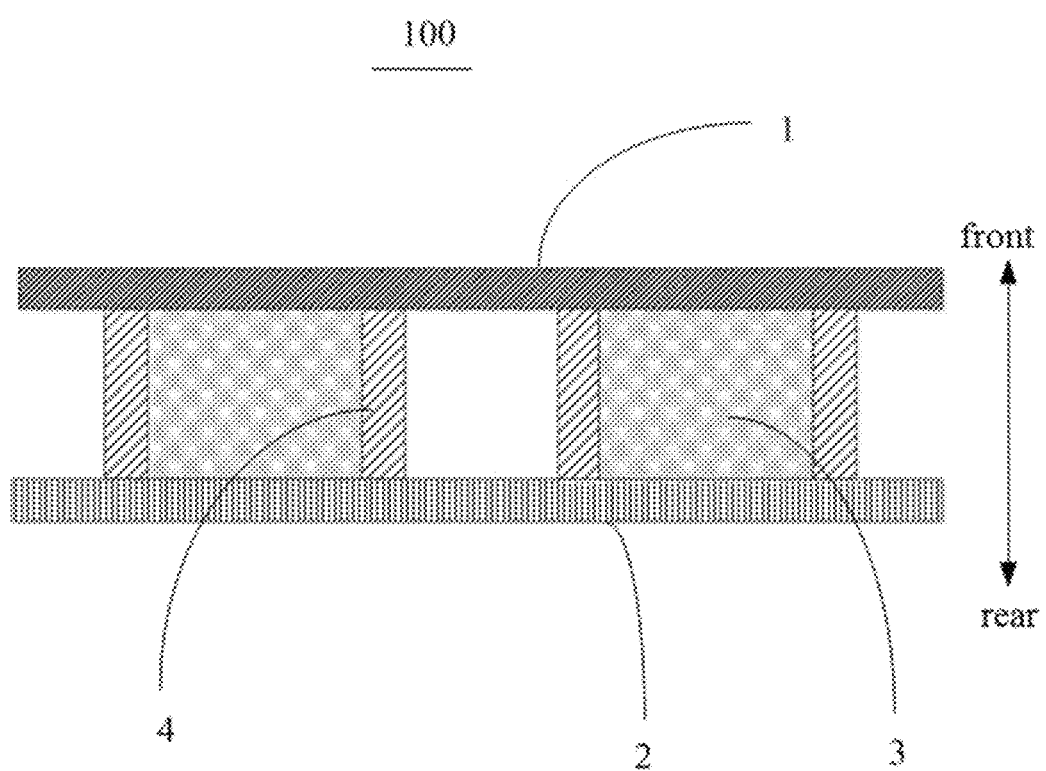
FIG. 35 is a schematic cross-sectional view in FIG. 34.

The present disclosure provides a touch key structure and an electrical appliance having the touch key structure. The electric appliance may be a cooking appliance, such as a rice cooker, an induction cooker, a cooking machine, a soymilk maker, or the like, and may also be other electric appliance such as an air conditioner, which is not limited in this application. All electrical appliances provided with the touch key structure are within the protection scope of the present disclosure, and the touch key structure provided in the present disclosure will be specifically described below with reference to the drawings. FIGS. 4 to 8 are a touch key structure according to a first embodiment of the present disclosure; FIGS. 9 to 16 are a touch key structure according to a second embodiment of the present disclosure; FIGS. 17 to 23 are a touch key structure according to a third embodiment of the present disclosure; FIGS. 24 to 33 are a touch key structure according to a fourth embodiment of the present disclosure; and FIGS. 34 to 35 are a touch key structure according to a fifth embodiment of the present disclosure.

In the embodiments of the present disclosure, referring to FIGS. 4 to 8, the touch key structure 100 includes a touch panel 1, a circuit board 2, and a conductive medium 3. The front side of the touch panel 1 has a key area for a user to touch (touch or approach) (in most cases, the key area forms a key identification, and the key identification may be a silk screen structure, or a bright area where LED light sees through the key area, etc.). The circuit board 2 is provided behind the touch panel 1, and a sensing electrode 21 is provided on the circuit board 2 corresponding to the key area. The conductive medium 3 is provided between the key area and the sensing electrode 21.

During a touch operation, a user's finger approaches or touches the key area, the sensing electrode 21 and the finger constitute a capacitor, which is referred to as a "touch capacitor," and the formation process is not described in detail. The conductive medium 3 is equivalent to adding a conductor between two electrodes of the touch capacitor, so that the touch capacitor becomes larger and it is easier to detect a finger. Therefore, in the present disclosure, the sensing electrode 21 and the conductive medium 3 are easy to be mounted and have good stability after mounting, thereby making the touch key structure 100 simple and reliable in structure.

The number and shape of the key area are not limited, and a plurality of the key areas set at a single point can be provided, or the key area can also be a sliding touch area set continuously. In the embodiments of the present disclosure, a plurality of the key areas, a plurality of the sensing electrodes 21 and a plurality of conductive media 3 are provided, and the key areas are in a one-to-one correspondence with the sensing electrodes 21 and the conductive media 3, and the specific number varies depending on the actual number of key areas. Besides, the relationship between the sensing electrode 21, the conductive medium 3, and the key area is not necessarily one-to-one correspondence, and one sensing electrode 21 may correspond to multiple key areas. The fingers are located in different key areas, and the capacitance between the finger and the sensing electrode 21 changes to identify different keys.

The material, structure, and shape of the conductive medium 3 are also not limited, depending on actual needs or the difficulty, cost, and so on of production and manufacturing. The conductive medium 3 may be made of a metal material, and the metal material has a high conductivity, which makes the touch capacitor have a larger capacitance. The conductive medium 3 may be a conductive body 3*b* or a conductive layer 3*a*. The conductive body 3*b* may be a metal conductive body 3*b* or a non-metal+metal mixed conductive body 3*b*. Alternatively, the conductive layer 3*a* may be provided through physical means or chemical plating. For example, the conductive layer 3*a* may be provided through water plating, evaporation, sputtering, electrophoresis, vacuum plating, spray coating, coating, chemical plating, etc. The physical means includes one of spray coating, brush coating, vacuum plating, and the like. Among them, spray coating, brush coating or vacuum plating can be selected, which is low cost and easy to implement.

The conductive medium 3 is provided in a manner that is not limited, and may be provided on the touch panel or on a mounting structure between the touch panel 1 and the circuit board 2. The following describes it in combination with specific embodiments:

Referring to FIGS. 4 to 8 and FIGS. 9 to 16, in the first embodiment and second embodiment of the present disclosure, the touch key structure 100 further includes a support 4, which is provided between the circuit board 2 and the touch panel 1. The conductive medium 3 is provided on the support 4, and specifically, the support 4 is a key support, and the circuit board 2 is provided with an LED lamp. The key support is also provided with a cylindrical structure for accommodating LED indicators. The cylindrical structure isolates the LED lights to avoid mutual influence of light between the LED lights, so that the LED lights form an indication identification on the touch panel 1.

Obviously, the support should be made of an insulating material. For example, the support 4 may be made of an insulating material with a material resistivity of $10^{10}$ Ω·cm to $10^{14}$ Ω·cm. The conductive medium may be made of a material with a resistivity of less than $10^{10}$ Ω·cm, and may be made of a material with a resistivity of less than $10^4$ Ω·cm. The lower the resistivity, the better the conductivity, and the higher the sensitivity of the touch key structure 100.

Referring to FIGS. 4 to 8, in the first embodiment of the present disclosure, the conductive medium 3 is a conductive body 3*b* provided on the support 4. The conductive body 3*b* can be provided in various shapes and sizes. The conductive body 3*b* has sufficient conductive medium, so that the touch key structure 100 has better touch sensitivity. The conductive body 3*b* may be a metal conductive body 3*b*. The conductive body 3*b* may be reliably mounted on the support 4, the conductive body 3*b* and the support 4 are relatively easy to be fixed, and the connection relationship between the conductive body 3*b* and the support 4 is not limited. In the present embodiment, the conductive body 3*b* is integrally connected with the support 4 through a secondary molding method. Specially, the support 4 is injection-molded first, and then the molded support 4 is inserted into a mold to form the conductive body 3*b*, so that the conductive body 3*b* is integrally connected with the support 4. The conductive body 3*b* will not be loose due to other mechanical connection methods, which will affect the touch sensitivity of the touch key structure 100, thereby making the touch key structure 100 stable and reliable.

Figure 8:
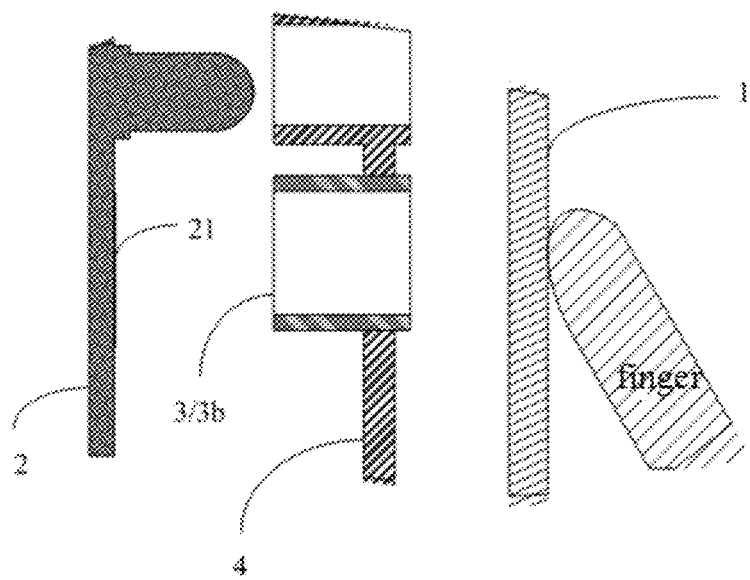
FIG. 8 is a partial exploded schematic view in FIG. 6.
Figure 9:
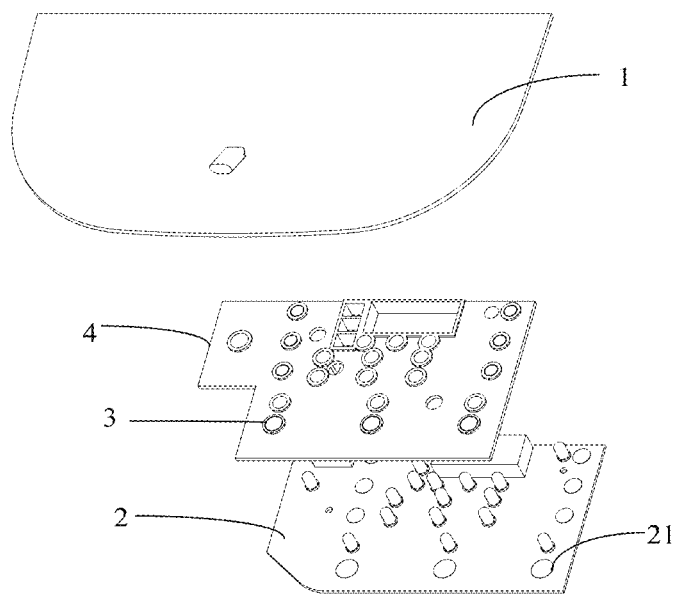
FIG. 9 is a schematic structural perspective view of a touch key structure according to a second embodiment of the present disclosure.
Figure 10:
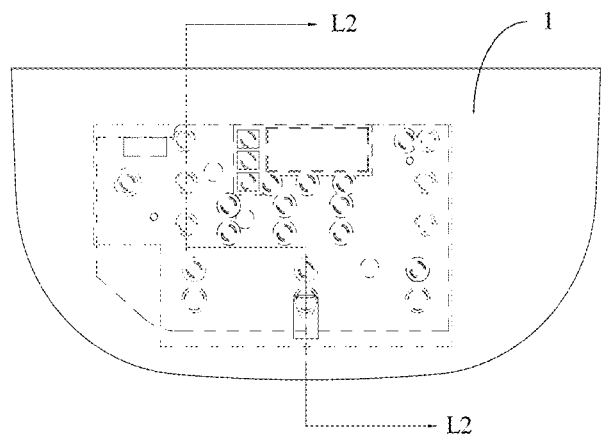
FIG. 10 is a schematic structural plan view in FIG. 9.
Figure 11:
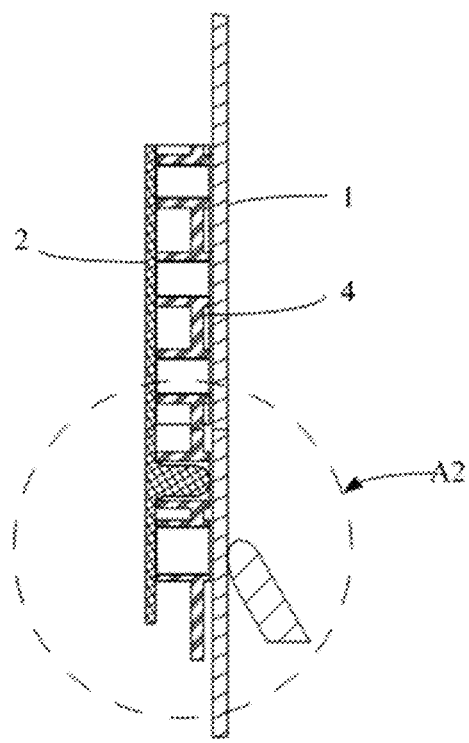
FIG. 11 is a schematic cross-sectional view taken along line L2-L2 in FIG. 10.
Figure 12:
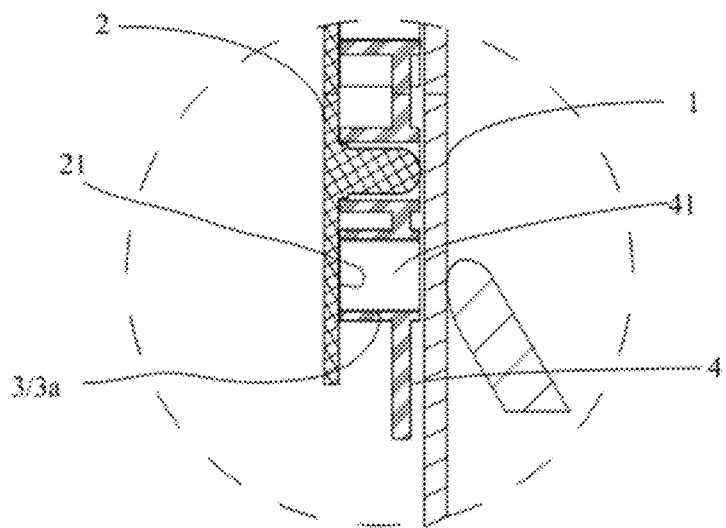
FIG. 12 is an enlarged view of portion A2 in FIG. 11.
Figure 13:
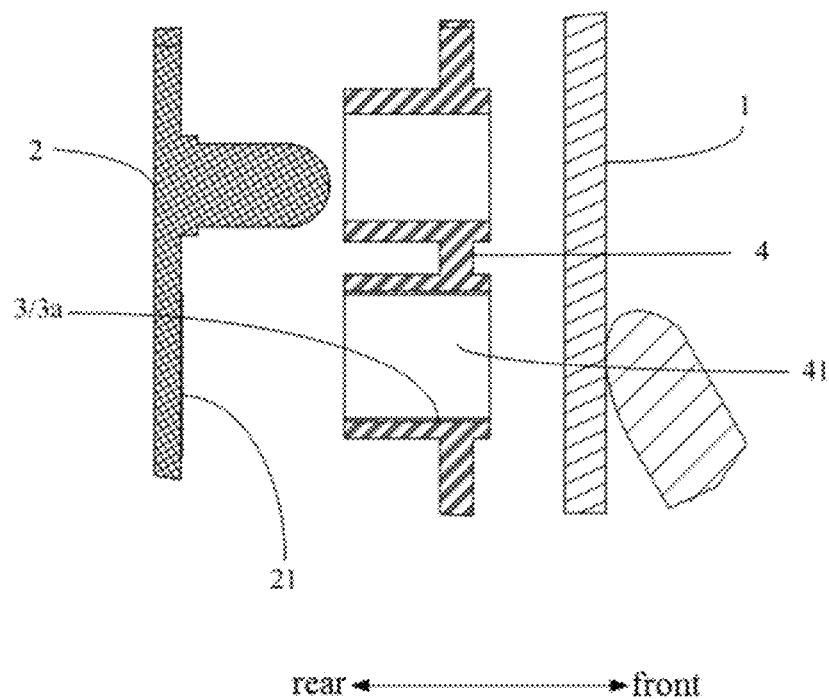
FIG. 13 is a partial exploded schematic view in FIG. 11.
Figure 14:
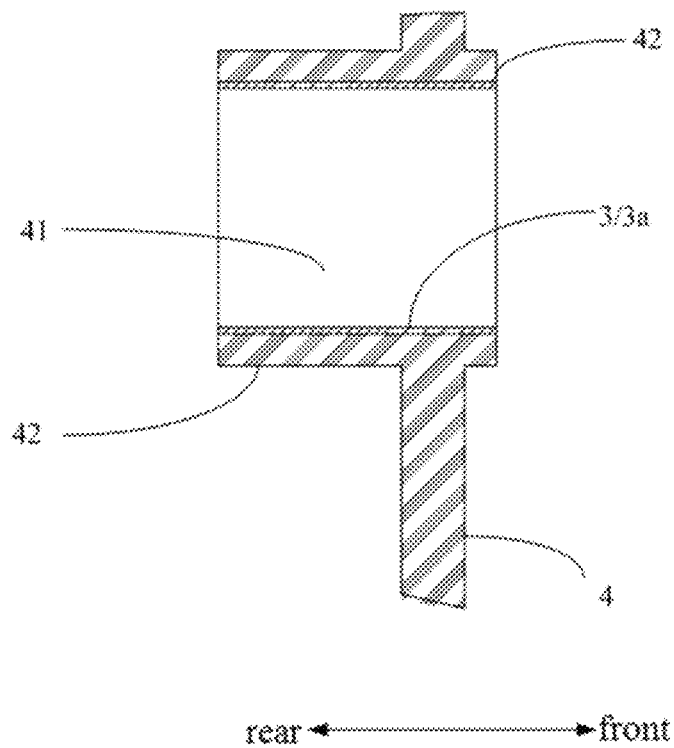
FIG. 14 is a partial schematic structural view of the support and the conductive layer in FIG. 11 according to a first implementation.

Further, in the first embodiment of the present disclosure, referring to FIG. 8, the conductive body 3b is mounted in the mounting hole 41 and at least one end (both ends in the present embodiment) of the conductive body 3b is exposed to the mounting hole 41, such that the conductive body 3b has a sufficient length. The distance between the sensing electrode 2 and the touch panel 1 is relatively short, thereby making the touch key structure 100 more sensitive.

Referring to FIGS. 9 to 16, in the second embodiment of the present disclosure, the conductive medium 3 is a conductive layer 3a provided on the support 4. Compared with providing the conductive body 3b on the support, it is easier to provide the conductive layer 3a on the support 4, and there is no problem of assembling and mounting between the conductive body 3b and the support 4. The conductive layer 3a may be formed on the support 4 through a physical means such as spray coating, brush coating, or vacuum plating or chemical plating.

Specially, referring to FIGS. 11 to 16, in the present embodiment, the support 4 is provided with a mounting hole 41, and the conductive layer 3a is provided in the mounting hole 41. Since the mounting hole 41 can form a sealing space by itself or by means of an external fixture, the conductive layer 3a may be provided on the inner wall of the mounting hole 41 through vacuum plating. Of course, it is obviously not limited to this, and chemical plating may also be used.

The mounting hole 41 may be a blind hole or a through hole. Please refer to FIG. 14 to FIG. 15, the mounting hole 41 is a through hole to avoid having an insulator between the key area and the sensing electrode 21, thereby affecting the size of the sensing capacitor and affecting the sensitivity of the touch key structure 100. Referring to FIG. 16, the mounting hole 41 is a blind hole. That is, only one end of the mounting hole 41 is opened. For this reason, when the conductive layer 3a is provided, vacuum plating may be preferentially used.

Besides, in the present embodiment, in order to make the conductive medium 3 have a sufficiently large size in the inner-outer direction, the support 4 includes a convex part 42 protruding towards at least one side, and the mounting hole 41 penetrates the convex part 42. Specially, in the present embodiment, the support 4 includes two convex parts 42 protruding towards both sides, the mounting hole 41 penetrates the two convex parts 42, such that the distance between the conductive medium 3 and the sensing electrode 21 and the distance between the conductive medium 3 and the key area are both small, so that the touch capacitance is sufficiently large and the sensing sensitivity is higher.

Figure 15:
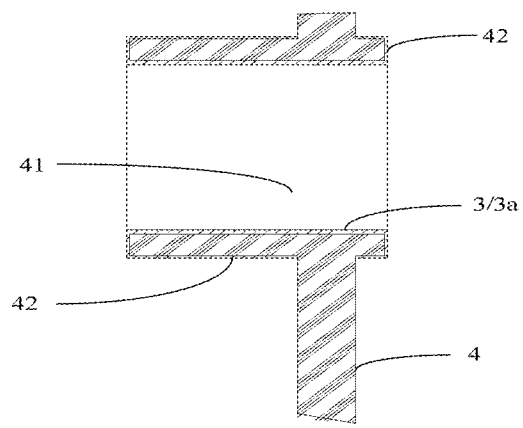
FIG. 15 is a partial schematic structural view of the support and the conductive layer in FIG. 11 according to a second implementation.
Figure 16:
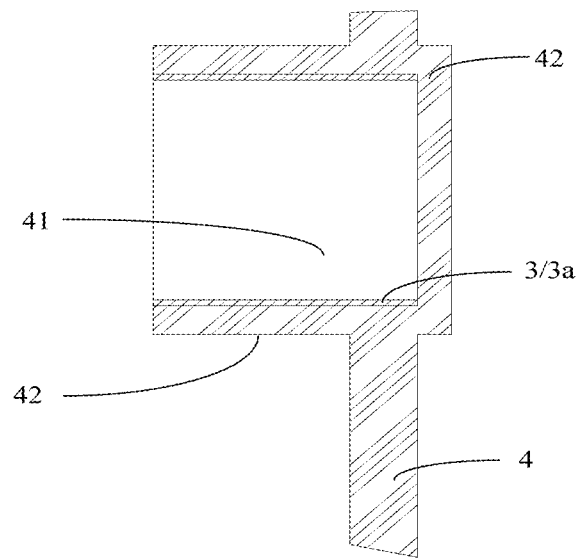
FIG. 16 is a partial schematic structural view of the support and the conductive layer in FIG. 11 according to a third implementation.
Figure 17:
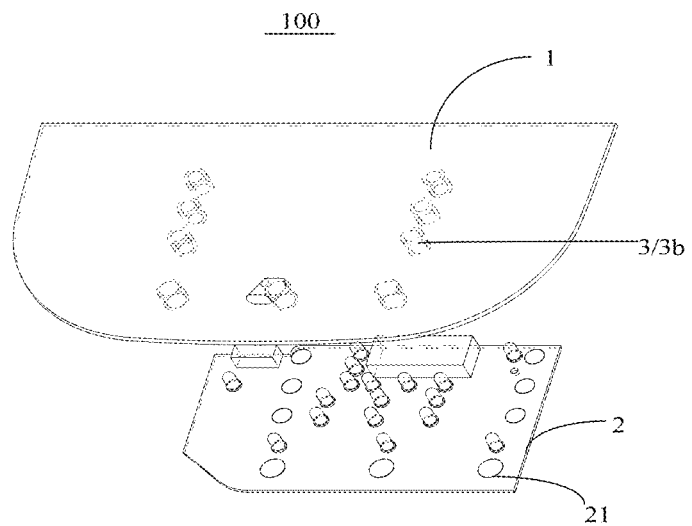
FIG. 17 is a schematic structural perspective view of a touch key structure according to a third embodiment of the present disclosure.
Figure 18:
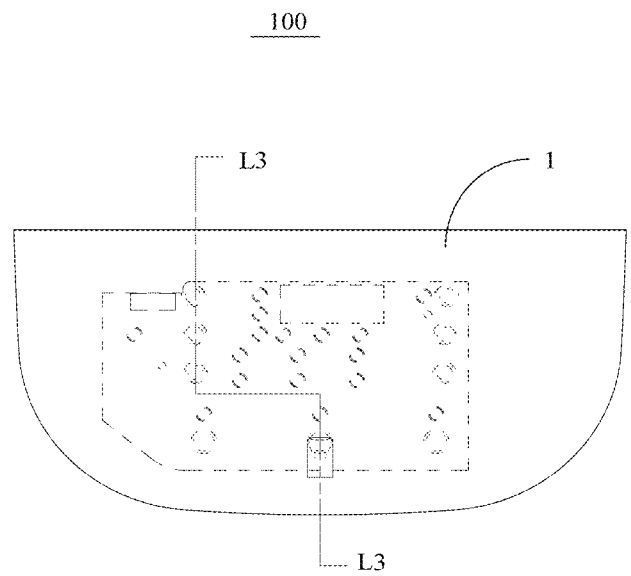
FIG. 18 is a schematic structural plan view in FIG. 17.
Figure 19:
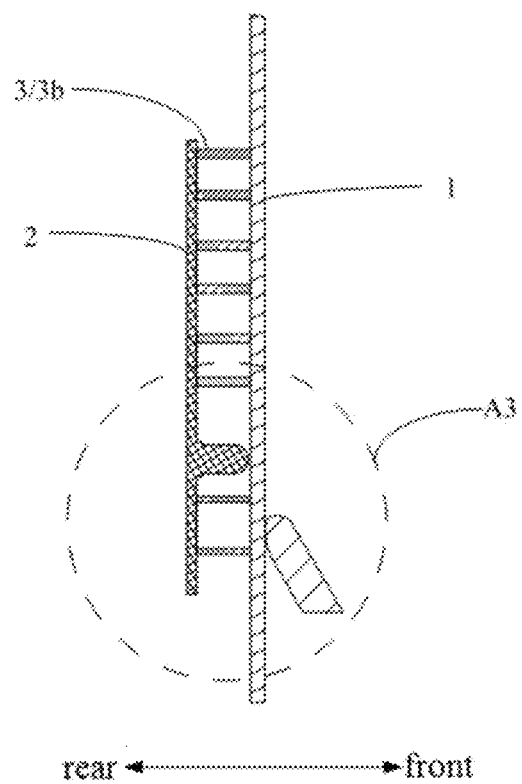
FIG. 19 is a schematic cross-sectional view taken along line L3-L3 in FIG. 18.
Figure 20:
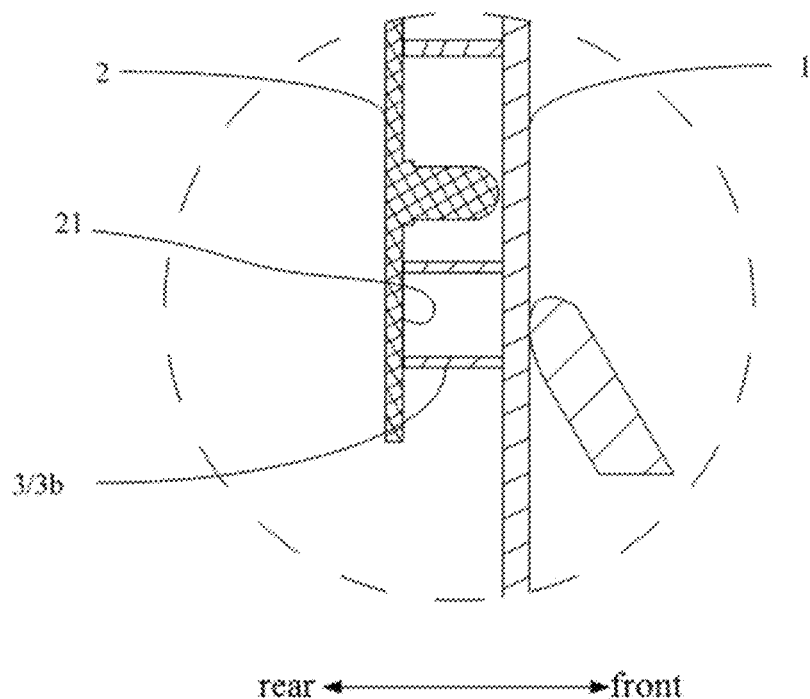
FIG. 20 is an enlarged view of portion A3 in FIG. 19.
Figure 21:
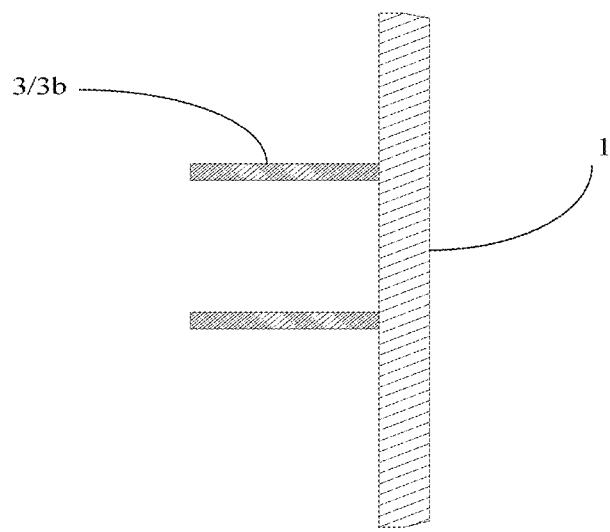
FIG. 21 is a partial schematic structural view of the touch panel and the conductive body in FIG. 18 according to a first implementation.
Figure 22:
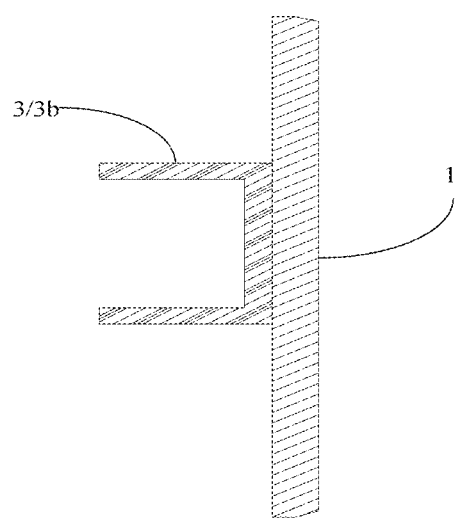
FIG. 22 is a partial schematic structural view of the touch panel and the conductive body in FIG. 18 according to a second implementation.
Figure 23:
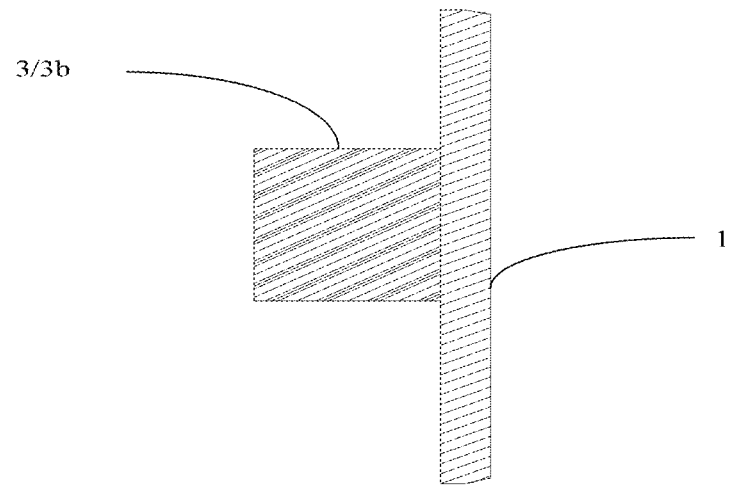
FIG. 23 is a partial schematic structural view of the touch panel and the conductive body in FIG. 18 according to a third implementation.
Figure 24:
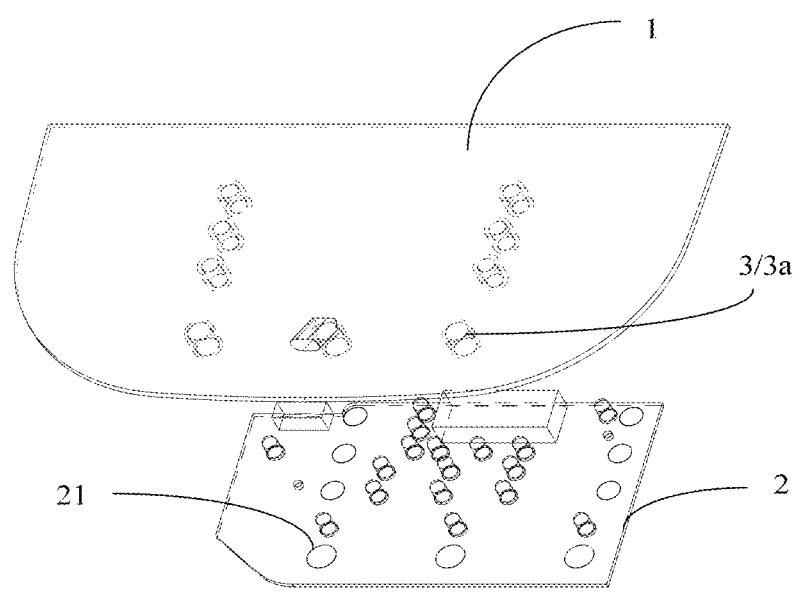
FIG. 24 is a schematic structural perspective view of a touch key structure according to a fourth embodiment of the present disclosure.
Figure 25:
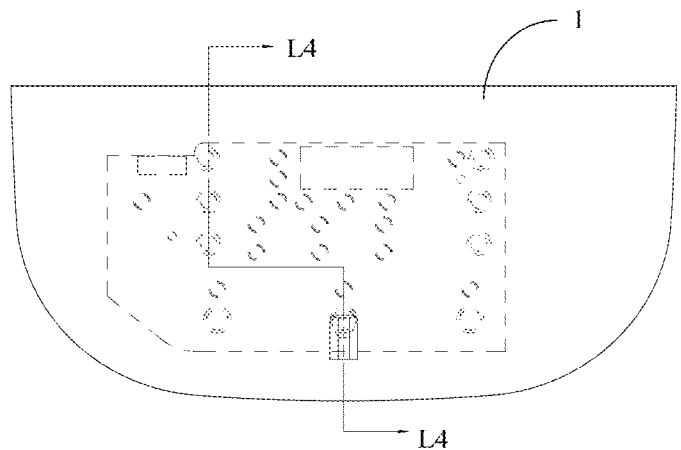
FIG. 25 is a schematic structural plan view in FIG. 24.
Figure 26:
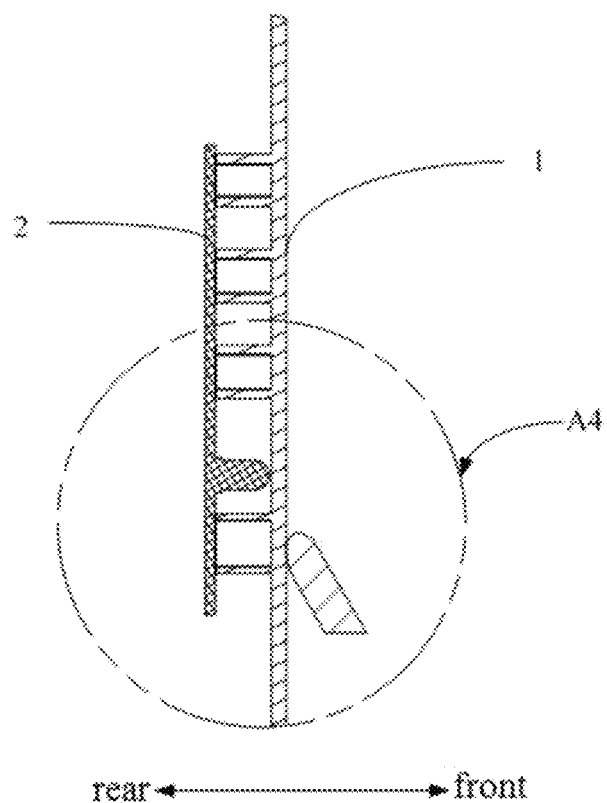
FIG. 26 is a schematic cross-sectional view taken along line L4-L4 in FIG. 25.
Figure 27:
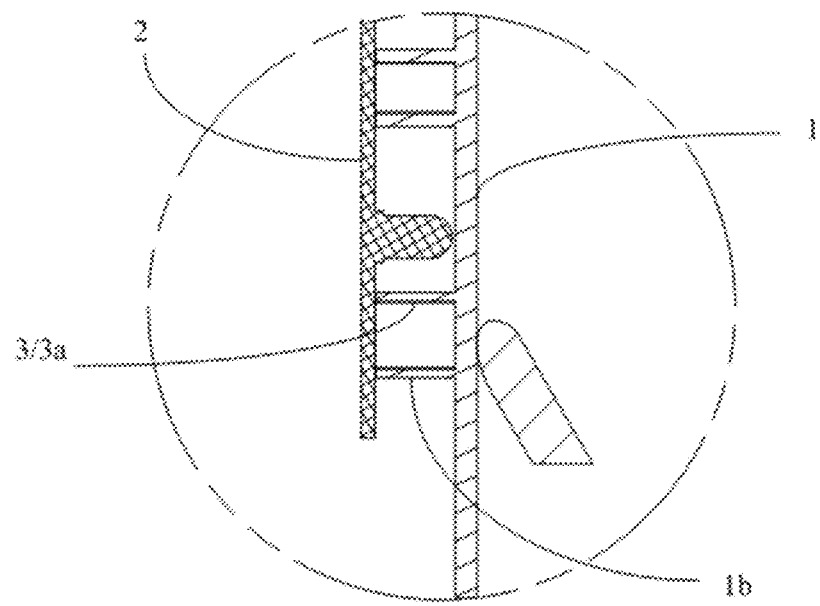
FIG. 27 is an enlarged view of portion A4 in FIG. 26.
Figure 28:
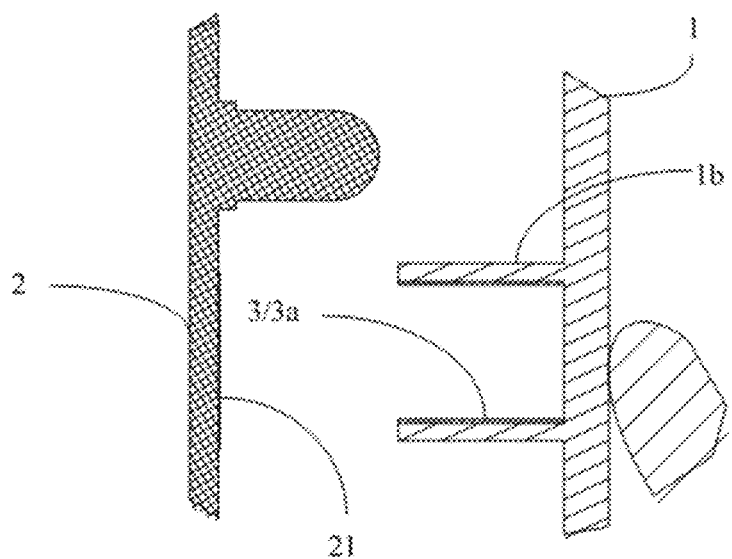
FIG. 28 is a partial exploded schematic view in FIG. 26.

Further, in the present embodiment, referring to FIG. 15, the outer surfaces of the convex parts 42 are all provided with the conductive layer 3a, and enough conductive medium 3 can be arranged, so that the touch capacitance is sufficiently large and the sensing sensitivity is higher.

Referring to FIGS. 17 to 23 and FIGS. 24 to 33, in the third and fourth embodiments of the touch key structure 100 provided in the present disclosure, the conductive medium 3 is provided on a rear side of the touch panel 1. In this way, the structure of the support 4 can be omitted compared to the first and second embodiments. Obviously, the design is not limited to this. The conductive medium 3 may be embedded in the touch panel 1. For example, the touch panel 1 is provided in multiple layers, and the conductive medium 3 is an intermediate layer provided on the touch panel 1, or a cavity may be formed inside the touch panel 1. The surface of the touch panel 1 is provided with an entrance communicating with the cavity, and the conductive medium 3 is provided in the cavity from the entrance.

Referring to FIGS. 17 to 23, according to a third embodiment of the present disclosure, the conductive medium 3 is a conductive body 3b provided on the rear side of the touch panel 1. The conductive body 3b may be fixed to the rear side of the touch panel 1 through, for example, screws, buckles, adhesives, and the like. In the present embodiment, the conductive body 3b is integrally connected with the touch panel 1 through secondary molding. Specially, first, the touch panel 1 is injection-molded, and then the formed touch panel 1 is embedded in a mold to form the conductive body 3b, such that the touch panel 1 is integrally connected with the conductive body 3b. The conductive body 3b will not be loosened due to other mechanical connection methods, which will affect the touch sensitivity of the touch key structure 100.

The specific structure or shape of the conductive body 3b is not limited. For example, referring to FIG. 21, the conductive body 3b is in a cylindrical shape with openings at both ends, and one end of the conductive body 3b is connected to the touch panel 1, to facilitate the connection between the conductive body 3b and the touch panel 1. Alternatively, referring to FIG. 22, the conductive body 3b is in a cylindrical shape with an open end and a closed end, and the closed end of the conductive body 3b is connected to the touch panel 1, such that there is a sufficient area between the conductive body 3b and the sensing electrode 21, which makes the touch capacitance larger. Further, referring to FIG. 23, the conductive body 3b is a solid conductive body 3b structure, and one end of the conductive body 3b is connected to the touch panel 1, such that the size of the conductive body 3b is larger, which makes the touch capacitance larger, thereby making the touch key structure 100 more sensitive.

Referring to FIGS. 24 to 33, according to a fourth embodiment of the present disclosure, the conductive medium 3 is a conductive layer 3a provided on the rear side of the touch panel 1. The conductive layer 3a is easier to combine with the touch panel 1 than the conductive body 3b. The conductive layer 3a may be directly formed on the rear side of the touch panel 1 through physical means (coating, brushing, and vacuum plating) or chemical plating.

Figure 29:
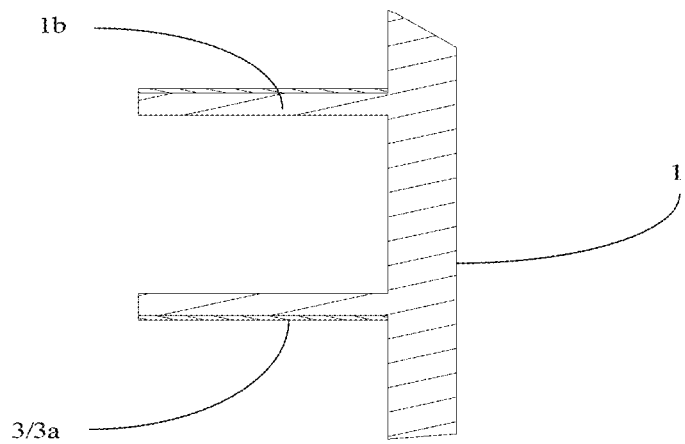
FIG. 29 is a partial schematic structural view of the touch panel and the conductive layer in FIG. 26 according to a first implementation.
Figure 30:
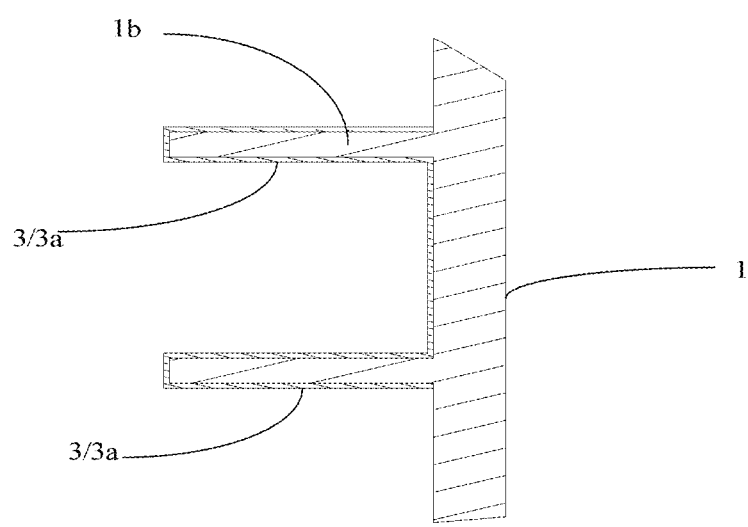
FIG. 30 is a partial schematic structural view of the touch panel and the conductive layer in FIG. 26 according to a second implementation.
Figure 31:
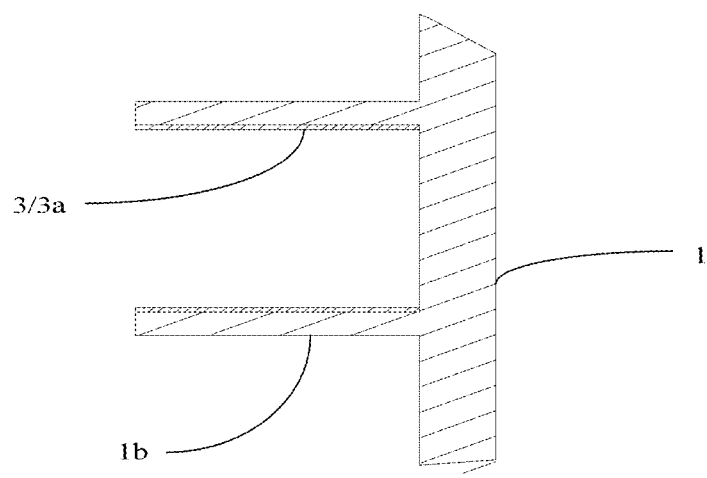
FIG. 31 is a partial schematic structural view of the touch panel and the conductive layer in FIG. 26 according to a third implementation.

Besides, in order to make the conductive medium 3 have a sufficient size in the inner-outer direction, and the distance between the conductive medium 3 and the sensing electrode 21 is small, so that the sensing sensitivity of the touch key structure 100 is high. In the present embodiment, the areas where the conductive layer 3a is provided are all protruding towards the touch electrode, and the specific shape of protruding structure is not limited. Referring to FIGS. 29 to 31, a cylindrical body 1b with an opening towards the circuit board 2 protrudes on the rear side of the touch panel 1, and the conductive layer 3b is provided on an inner side, an outer side, and/or a rear end of the cylindrical body 1b. As shown in FIG. 29, the conductive layer 3b is provided on the outer side of the cylindrical body 1b, such that the conductive layer 3a can be provided on the cylindrical body 1b through spraying or brushing, which is convenient for mounting. As shown in FIG. 30, the conductive layer 3b is provided on the inner side, the outer side, and the rear end surface of the cylindrical body 1, such that the layout area of the conductive layer 3a is large, which makes the touch capacitance larger. As shown in FIG. 31, the conductive layer 3b is provided on the inner side of the cylindrical body 1, and the conductive layer 3a can be formed through vacuum plating or chemical plating. Referring to FIGS. 32 and 33, a pillar 1a protrudes on the rear side of the touch panel 1, and the conductive layer 3a is provided on an outer side and/or a rear end surface of the pillar 1a. As shown in FIG. 32, the conductive layer 3a is only provided on the outer side of the pillar 1a. As shown in FIG. 33, the conductive layer 3a is provided on both the outer side and the end surface of the pillar 1a, and a sufficient number of the conductive media 3 can be provided.

Referring to FIG. 34 and FIG. 35, according to a fifth embodiment of the present disclosure, a distance between the conductive medium 3 and the sensing electrode 21 is d1, and a distance between the conductive medium 3 and the touch panel 1 is d2. Theoretically, the smaller d1 and d2 indicate that the distance between the conductive medium 3 and the sensing electrode 21 and the key area is sufficiently small, so that the touch capacitance is small and the sensitivity is high. Thus, in the present embodiment, a sum of d1 and d2 is greater than or equal to 0 and less than or equal to 2 mm.

A periphery of the area where the conductive medium 3 is laid out is exceeding the sensing electrode 21, such that the conductive medium 3 can completely cover the edge of the sensing electrode 21. Obviously, an exceeding size cannot be too large, if it is too large, the distance between adjacent conductive media 3 is too small. Therefore, in the present embodiment, a periphery of the conductive medium 3 is exceeding the sensing electrode 21, and an exceeding size is H, and H is less than or equal to 3 mm.

The conductive medium 3 is a conductive layer 3a formed through spraying, and a thickness of the conductive layer 3a is D. Theoretically, the larger D is, the better, but the size of D is also limited by the process. In the present embodiment, D is greater than or equal to 10 μm and less than or equal to 25 μm.

In the present embodiment, limited by the distance between the touch panel 1 and the circuit board 2, a size of the conductive medium is K in a front-rear direction, and K is less than 15 mm.

The conductive medium 3 may be a discontinuous structure. For example, the conductive medium 3 includes a plurality of sections arranged on the front-rear direction, and may also be a continuous structure. When the conductive medium 3 is the continuous structure, the touch capacitance is larger than the discontinuous structure. In the present embodiment, each of the conductive media 3 is continuously disposed.

The conductive medium 3 is a conductive layer 3a, and the conductive medium 3 is made of the material selected from nickel powder, aluminum powder, silver powder, and silver copper powder. These metals have good stability and excellent electrical conductivity.

In the present embodiment, a support 4 is provided between the touch panel 1 and the circuit board 2, a mounting hole 41 is formed in the support 4, and the conductive medium 3 is a conductive layer 3a provided on an inner wall of the mounting hole 41. In the present embodiment, the conductive medium is a conductive paint, and preferably, the resistance value of the conductive paint is controlled between 0.2Ω and 0.6Ω. Therefore, the touch key structure 100 has proper sensitivity.

The conductive medium 3 is a conductive layer 3a, and the conductive medium 3 is made of the material selected from nickel powder, aluminum powder, silver powder, and silver copper powder. These metals have good stability and excellent electrical conductivity, and/or the support 4 is made of an insulating material suitable for injection molding and selected from PP, ABS, PA, PMMA, PC, PC/ABS, and bakelite.

The above are only preferred embodiments of the present disclosure, and thus do not limit the scope of the present disclosure. In addition, in the case of no contradiction, the embodiments can be combined with each other. Under the concept of the present disclosure, the equivalent structural transformations made by the present specification and the drawings are directly or indirectly applied to other related technical fields, and are included in the scope of the present disclosure.

What is claimed is:

1. A touch key structure comprising:
   a touch panel including a key area at a front side of the touch panel;
   a circuit board provided behind the touch panel and including a sensing electrode corresponding to the key area;
   a support provided between the circuit board and the touch panel, the support including:
      a convex part protruding towards at least one side; and
      a mounting hole penetrating the convex part; and
   a conductive medium provided at the support and between the key area and the sensing electrode, the conductive medium including a conductive layer provided at an inner wall of the mounting hole.

2. The touch key structure of claim 1, wherein:
   the key area is one of a plurality of key areas provided at the front side of the touch panel;
   the sensing electrode is one of a plurality of sensing electrodes of the circuit board;
   the conductive medium is one of a plurality of conductive media provided between the key areas and the sensing electrodes; and
   the key areas, the sensing electrodes, and the conductive media are in a one-to-one correspondence.

3. The touch key structure of claim 1, wherein:
   the conductive layer is formed through a physical means or a chemical plating means.

4. The touch key structure of claim 1, wherein the conductive medium further includes a conductive body provided at the support.

5. The touch key structure of claim 4, wherein the conductive body is integrally connected with the support through a secondary molding method.

6. The touch key structure of claim 4, wherein:
   the conductive body is mounted in the mounting hole and at least one end of the conductive body is exposed from the mounting hole.

7. The touch key structure of claim 1, wherein the conductive layer is further provided at an outer surface of the convex part.

8. The touch key structure of claim 1, wherein the conductive medium further includes a conductive body provided at the rear side of the touch panel.

9. The touch key structure of claim 8, wherein the conductive body is integrally connected with the touch panel through a secondary molding method.

10. The touch key structure of claim 8, wherein:
    the conductive body is in a cylindrical shape with openings at both ends, and one end of the conductive body is connected to the touch panel; or
    the conductive body is in a cylindrical shape with an open end and a closed end, and the closed end of the conductive body is connected to the touch panel; or the conductive body includes a solid conductive body structure, and one end of the conductive body is connected to the touch panel.

11. The touch key structure of claim 1, wherein:
a sum of a distance between the conductive medium and the sensing electrode and a distance between the conductive medium and the touch panel is greater than or equal to 0 and less than or equal to 2 mm; or
a periphery of the conductive medium exceeds the sensing electrode by an exceeding size less than or equal to 3 mm; or
the conductive medium includes a conductive layer having a thickness greater than or equal to 10 μm and less than or equal to 25 μm; or
a size of the conductive medium in a front-rear direction is less than 15 mm.

12. The touch key structure of claim 1, wherein the key area includes a key identification.

13. An electrical appliance comprising:
a touch key structure including:
 a touch panel including a key area at a front side of the touch panel;
 a circuit board provided behind the touch panel and including a sensing electrode corresponding to the key area;
 a support provided between the circuit board and the touch panel, the support including:
  a convex part protruding towards at least one side; and
  a mounting hole penetrating the convex part; and
 a conductive medium provided at the support and between the key area and the sensing electrode, the conductive medium including a conductive layer provided at an inner wall of the mounting hole.

14. A touch key structure comprising:
a touch panel including a key area at a front side of the touch panel;
a circuit board provided behind the touch panel and including a sensing electrode corresponding to the key area; and
a conductive medium provided between the key area and the sensing electrode, the conductive medium being at a rear side of the touch panel or embedded inside the touch panel, and the conductive medium including a conductive layer provided at the rear side of the touch panel;
wherein the touch key structure further includes:
 a pillar protruding on the rear side of the touch panel, the conductive layer being provided on at least one of an outer side or a rear end surface of the pillar; or
 a cylindrical body with an opening towards the circuit board and protruding on the rear side of the touch panel, the conductive layer being provided on at least one of an inner side, an outer side, or a rear end surface of the cylindrical body.

* * * * *